(12) United States Patent
Somayajula

(10) Patent No.: US 6,538,594 B1
(45) Date of Patent: Mar. 25, 2003

(54) METHODS AND CIRCUITS FOR COMPENSATING FOR FINITE COMMON MODE REJECTION IN SWITCHED CAPACITOR CIRCUITS

(75) Inventor: Shyam Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/919,021

(22) Filed: Jul. 30, 2001

(51) Int. Cl.[7] ............................................. H03M 1/10
(52) U.S. Cl. ...................................... 341/172; 341/120
(58) Field of Search ............................. 341/172, 143, 341/155; 343/118, 120, 150

(56) References Cited

U.S. PATENT DOCUMENTS

| 4,803,462 A | 2/1989 | Hester | 341/172 |
| 4,989,002 A | 1/1991 | Tan | 341/120 |
| 5,955,978 A | * 9/1999 | Fiedler et al. | 341/118 |
| 5,963,156 A | * 10/1999 | Lewicki et al. | 341/122 |

* cited by examiner

Primary Examiner—Peguy JeanPierre
(74) Attorney, Agent, or Firm—James J. Murphy, Esq.; Winstead Sechrest & Minick, P.C.

(57) ABSTRACT

A method of compensating for finite common mode rejection in a switched capacitor circuit including arrays of input capacitors coupled to first and second differential nodes, includes the step of sampling a common mode voltage onto the differential nodes during a sampling phase. The input capacitors are then coupled to a ground node against which the common mode voltage is referenced to capture an offset voltage between the first and second differential nodes. The voltage offset is then subtracted out.

17 Claims, 4 Drawing Sheets

METHODS AND CIRCUITS FOR COMPENSATING FOR FINITE COMMON MODE REJECTION IN SWITCHED CAPACITOR CIRCUITS

CROSS-REFERENCE TO RELATED APPLICATIONS

This application for patent is related to the following applications for patent:

U.S. patent application Ser. No. 09/919,181, filed Jul. 30, 2001, entitled "CIRCUITS AND METHODS FOR OFFSET VOLTAGE COMPENSATION IN A CHARGE REDISTRIBUTION DIGITAL TO ANALOG CONVERTER" by inventor Shyam S. Somayajula currently pending;

U.S. patent application Ser. No. 09/919,014, filed Jul. 30, 2001 by inventor Somayajula, entitled "A HIGH SPEED SUCCESSIVE APPROXIMATION RETURN PATH AND DATA CONVERSION METHODS AND CIRCUITS USING THE SAME" currently pending U.S. patent application Ser. No. 09/919,411, filed Jul. 30, 2001 by inventor Somayajula, entitled "CIRCUITS AND METHODS FOR LATCH METASTABILITY DETECTION AND COMPENSATION AND SYSTEMS USING THE SAME" currently pending U.S. patent application Ser. No. 09/919,410, filed Jul. 30, 2000 by inventor Somayajula, entitled "ANALOG TO DIGITAL CONVERSION CIRCUITS, SYSTEMS AND METHODS WITH GAIN SCALING SWITCHED-CAPACITOR ARRAY" currently pending U.S. patent application Ser. No. 09/918,852, filed Jul. 30, 2001 by inventor Somayajula, entitled "CIRCUITS AND METHODS FOR LINEARIZING CAPACITOR CALIBRATION AND SYSTEMS USING THE SAME", currently pending; and U.S. patent application Ser. No. 09/918,616, filed Jul. 30, 2001 by inventor Somayajula, entitled "HIGH SPEED, LOW-POWER SHIFT REGISTER AND CIRCUITS AND METHODS USING THE SAME" currently pending.

FIELD OF INVENTION

The present invention relates in general to switched capacitor circuits and in particular to methods and circuits for compensating for finite common mode rejection in switched capacitor circuits.

BACKGROUND OF INVENTION

One particular technique for performing analog to digital (A/D) conversion is through successive approximation. The basic successive approximation A/D converter (ADC) includes an analog comparator and a clocked feedback loop having a successive approximation register (SAR) and a digital to analog converter (DAC).

Generally, the analog input signal voltage is sampled onto an array of weighted capacitors, during the sampling phase, the top plates of which are coupled to one comparator input. The other comparator input is coupled to a comparison voltage, which could be a fixed reference voltage in a single-ended system or the voltage at the top plates of second capacitor array in a differential system.

During the first clock cycle of the subsequent conversion phase, the bottom plate of the capacitor representing the digital MSB is coupled to a reference voltage while the bottom plates of the remaining capacitors in the array are coupled to ground or a second reference voltage (ground will be assumed here). The new top plate voltage appears at the input of the comparator and is compared against the comparison voltage. If the new top plate voltage is below the comparison voltage, then the MSB is "kept" by the SAR in the feedback loop by maintaining its bottom plate coupled to the reference voltage. On the other hand, if the top plate voltage is above the comparison voltage, the SAR couples and the bottom plate of the MSB capacitor to ground. The state of the MSB capacitor represent the MSB of the digital output word as a Logic 1. The bottom plate of the second MSB is then coupled to the reference voltage and the same test is performed to determine the state of the next digital code bit. The successive approximation algorithm continues by repeating this procedure for the remaining capacitors in the array such that the voltage difference at the inputs to the comparator converge to zero. At the end of this bit cycling process, the configuration of the switches coupling the bottom plates either to Vref or Gnd represents the input sample in digital form.

Successive approximation A/D converters are useful a wide range of applications, including data acquisition, test equipment, instrumentation, cellular communications, among others. Notwithstanding, in order to improve and broaden the utility of this type of A/D converter, significant challenges remain to be addressed. These challenges include improving the device speed given a set of process constraints, reducing the coding error rate, handling metastable states and device calibration

SUMMARY OF INVENTION

In accordance with the inventive concepts, circuits and methods are disclosed for compensating for a finite common mode rejection in switch capacitor circuitry. Such circuits and methods are particularly useful in circuitry such as charge redistribution analog to digital converters, although not necessarily limited thereto.

According to one embodiment of the inventive concepts, a method is disclosed for compensating for finite common mode rejection in a switched capacitor circuit including arrays of input capacitors coupled to first and second differential nodes. A common mode voltage is sampled onto the differential nodes during a sampling phase. Next, the input capacitors are coupled to a ground node against which the common mode voltage is referenced to capture an offset voltage between the first and second differential nodes. The voltage offset is then subtracted out.

Advantageously, any voltage offset caused by the finite common mode rejection of the input capacitor arrays at a given common mode voltage in a switch capacitor circuitry can easily be compensated for. With respects to circuits and systems including a comparator or similar operational amplifier circuit also introducing an input offset voltage, both the offset caused by the finite common mode rejection and that caused by the operational amplifier circuit can be subtracted out simultaneously. This feature is particularly useful in a charge redistribution analog to digital converters where an input voltage offset, no matter the source, can cause errors in the digital encoding.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5B of the drawings, in which like numbers designate like parts.

Figure 1:
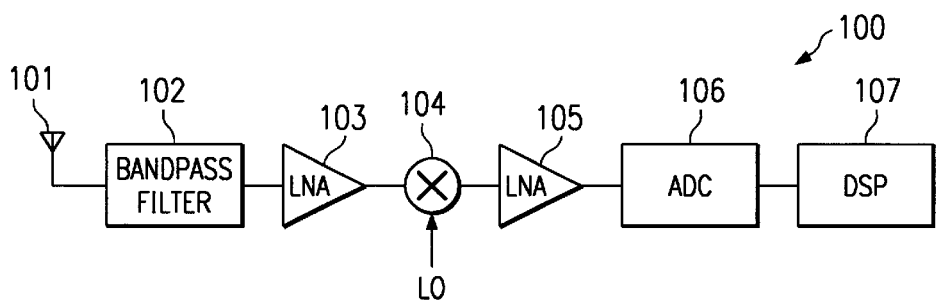
FIG. 1 is a high level block diagram of a digital receiver suitable for describing the principles of the present invention.

FIG. 1 is a high level block diagram of a digital receiver 100 suitable for describing the principles of the present invention. Generally, receiver 100 includes an RF input port or antenna 101 for receiving an RF signal, such as those used in telecommunications, and radio and television transmission. The desired RF signal is then extracted from the received signal by a bandpass filter 102. A low noise amplifier (LNA) 103 sets the system noise figure before the RF signal is downconverted in frequency by a mixer stage 104 operating in response to a local oscillator (LO). The output of mixer stage 104 may be passed through a second low noise amplifier (LNA) 105 before conversion into the digital domain.

In system 100, analog to digital conversion is performed using analog to digital converter (ADC) 200 discussed in detail below. Once converted into the digital domain, the received data can be processed using a digital signal processor (DSP) subsystem 106.

Figure 2:
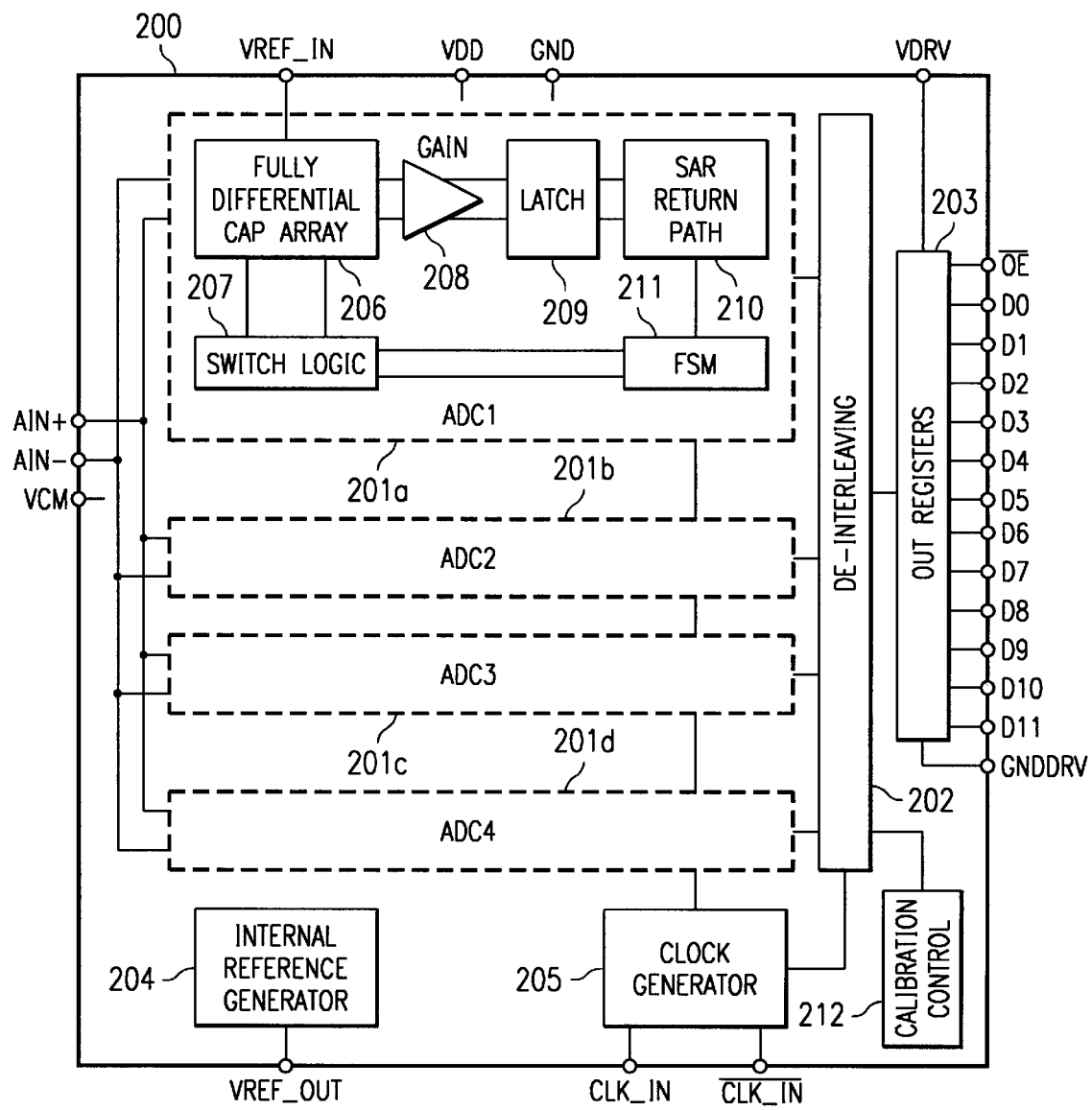
FIG. 2 is a high level functional block diagram of a single-chip analog to digital converter suitable for describing the present inventive concepts.

FIG. 2 is a high level functional block diagram of a single-chip analog to digital converter 200 suitable for describing the present inventive concepts. A/D converter 200 is based on 4 interleaved successive-approximation A/D converters (ADCs) 201, which will be discussed further below. The digitally coded samples are de-interleaved in block 202 and output through output register 203. A/D converter 200 also includes an on-chip reference voltage generator 204, clock generator 205 and clock generation circuitry 206.

Each of the ADCs 202 includes a fully differential capacitor array 206 under control of switch control circuitry 207. During the tracking mode, capacitor array 206 samples the input voltage at the differential analog inputs AIN+ and AIN−. During the hold mode, the sampled charge is held while the successive approximation algorithm generates the digital bits.

A gain stage 208 with minimal gain provides signal isolation in front of latch (comparator) 209. SAR return path 210 and FSM 211 feedback the reference voltage to capacitor array 206.

In a conventional charge redistribution DAC, the bottom plate of a graduated filter array is coupled to the input during the sampling phase and all capacitors are charged to the input signal voltage. After the capacitors are charged, their bottom plates are coupled to ground during hold phase such that the top plates of the capacitors are at a voltage $V_X$ which is approximately equal to $-A_{IN}$, where $A_{IN}$ is the input sample voltage. During bit cycling, the bottom plate of the capacitor representing the MSB is coupled to the reference and the voltage of the top plate compared against the reference. The bottom capacitors of the remaining capacitors remain coupled to ground to form a voltage divider. If upper plate voltage is below the reference, then the capacitor continues to be coupled to the reference (i.e. a logic 1 for the bit), otherwise the bottom plate of the capacitor is recoupled to ground (i.e. reset to 0).

One problem encountered in the design of comparators is the input offset voltage between its differential inputs. The effect of this offset is a shift, either up or down, in the input threshold voltage above which the comparator output swings towards the high output rail and below which the comparator output swings towards the low voltage rail. In the particular case of a successive approximation circuit, a shifting in the threshold voltage can cause the comparator to swing in the wrong direction, especially when the feedback loop voltage closely approaches the input sample voltage during the generation of the least significant bits. The comparator input offset voltage thus can result in the mis-coding of one or more bits in the digital output word. Specifically, the offset must be kept below the voltage corresponding to ½ LSB to avoid coding errors.

Common mode rejection (CMR) is another problem which much be addressed in differential systems, such as ADCs 201. In the ideal case, the sampled analog input signal $A_{IN}$ will be symmetric around the common mode voltage $V_{CM}$, when seen at the differential inputs to the comparator. (For purposes of the present discussion, it will be assumed that $V_{CM}$ is a stable voltage of approximately $$\frac{V_{REF}}{2},$$

although this voltage may change depending on the specific design). With respects to actual circuits however, the impedances of the capacitor arrays at the comparator inputs will not match. The resulting non-infinite CMR appears as an additional offset voltage at the comparator inputs which contribute to the error into the SAR bit conversion process. The state of the input arrays after the normal mode sampling phase is represented by Equation (1):

$$VaP - VaN = \left[\left(\frac{C_{INPVrf}}{C_{TOTP}} + \frac{C_{INNSgnd}}{C_{TOTN}}\right) - \left(\frac{C_{InnVref}}{C_{TOTN}} + \frac{C_{inpSgnd}}{C_{TOTP}}\right)\right] \cdot V_{REF} - \frac{A_{IN}}{2} \cdot \left[\frac{C_{INTOTP}}{C_{TOTP}} + \frac{C_{INTOTN}}{C_{TOTN}}\right] - V_{cm} \cdot \left[\frac{C_{INTOTP}}{C_{TOTP}} - \frac{C_{INTOTN}}{C_{TOTN}}\right]$$

where:
  VaP=voltage at the positive comparator input;
  VaN=voltage at the negative comparator input;
  $C_{TOTP}$=total capacitance coupled to the positive input node;
  $C_{INPVRF}$=total input capacitance at the positive comparator input coupled to $V_{REF}$ after bit-cycling;
  $C_{TOTN}$=total capacitance coupled to the negative input node;

$C_{INNVRF}$=total input capacitance at the negative comparator input coupled to $V_{REF}$ after bit-cycling;

$C_{INTOTP}$=total input capacitance coupled to the positive input node; and $C_{INTOTN}$=total input capacitance coupled to the negative input node.

The last term of this equation represents the offset component at the comparator inputs caused by a non-zero common mode voltage and a capacitance mismatch between the input capacitors of the positive and negative paths. Depending on the size of this offset and the bit being generated, this offset can contribute, at least in part, to the comparator output swinging in the wrong direction.

Figure 3:
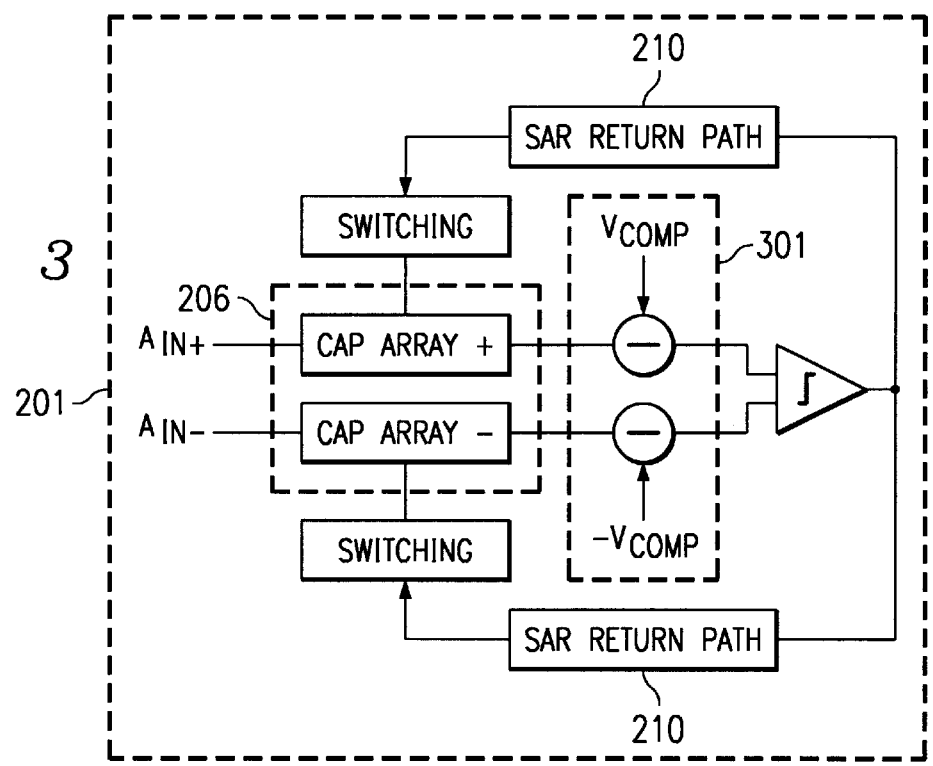
FIG. 3 is a high level functional diagram of one offset compensation circuit according to the principles of the present invention.

One circuit embodiment of the principles of the present invention is shown in FIG. 3. In this case, an error cancellation (compensation) stage 301, which is preferrably a subtractor, is placed in front of the comparator. This cancellation stage receives feedback from the comparator output and cancels out the input voltage offset caused by the comparator and the finite CMR of the capacitor arrays at a given input CM voltage. The feedback loop allows the input offset to be dynamically cancelled as the input sample and reference voltages change and/or if the sampling or clock frequencies change. Cancellation stage 301 performs the cancellation operation in the analog domain, although its control is performed in the digital domain. A preferred charge redistribution DAC suitable with an integral offset compensation (cancellation) circuitry is discussed below in conjunction with FIGS. 4A–4C.

Figure 4A:
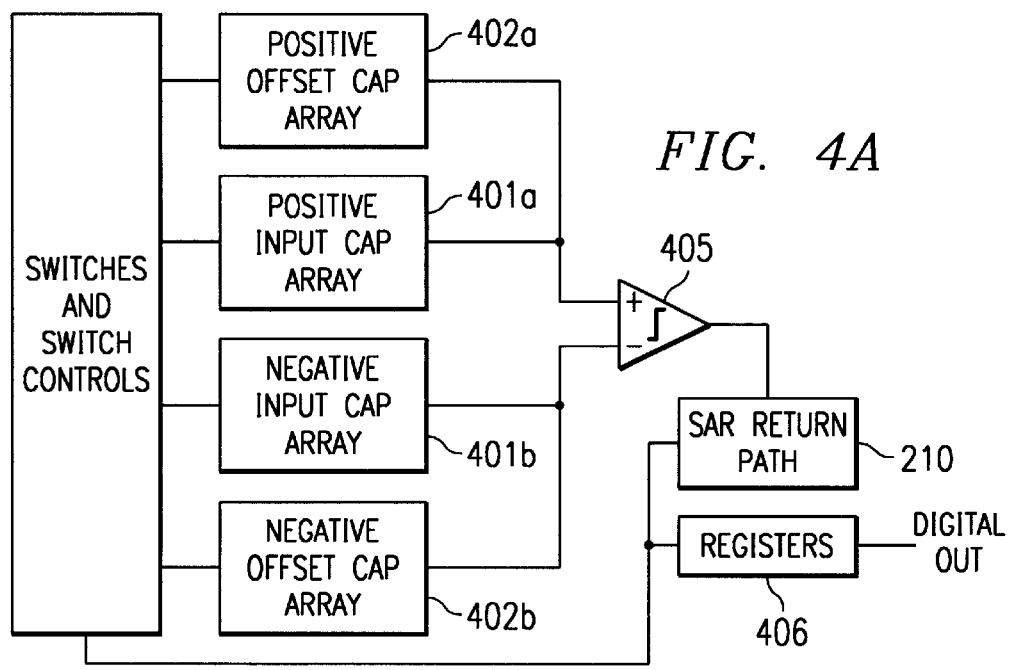
FIG. 4A is a functional block diagram of a switched-capacitor charge redistribution ADC embodying the present principles.
Figure 4B:
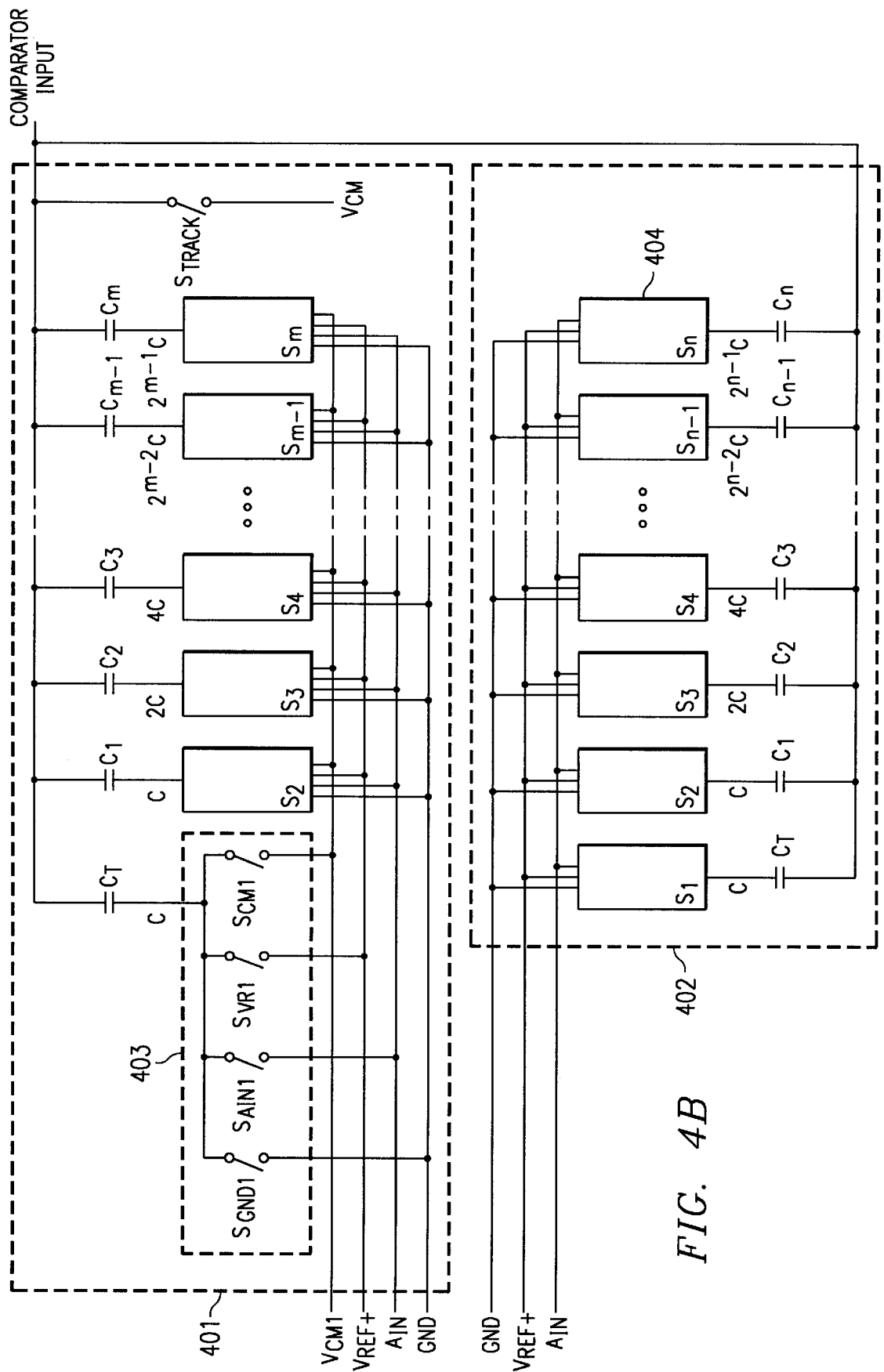
FIG. 4B illustrates one pair of the capacitor arrays of FIG. 4A, in further detail.

A switched-capacitor charge redistribution DAC 400 embodying the present principles is shown in FIG. 4A. In this embodiment, two capacitor arrays are provided for each of the paths into the positive and negative differential inputs into comparator 404, namely, Input Capacitor Array 401 and Offset Compensation Capacitor Array 402. One pair of arrays 401 and 402 is shown in further detail in FIG. 4B. Input Capacitor Array 401 comprises a termination capacitor $C_T$ and an array of capacitors $C_{INi}$, i=1 to m graduated in the sequence C, 2C, 4C, ... $2^{m-2}$C, $2^{m-1}$C(ff). In the following discussion, input capacitors 401 coupled to the positive comparator input are designated $C_{INPi}$ and those coupled to the negative comparator input designated $C_{INNi}$. Generally, the termination capacitors do not participate in the bit-cycling process, except during capacitance calibration (trim) operations.

Offset Compensation Capacitor Array 402, comprises a termination capacitor $C_T$ and an array of capacitors $C_{OFFj}$, j=1 to n, graduated in the sequence C, 2C, 4C, ... $2^{n-2}$C, $2^{n-1}$C (ff). Offset capacitors coupled to the positive comparator input are designated $C_{OFFPj}$ and those coupled to the negative comparator input $C_{OFFNj}$.

The bottom plate of each capacitor in array 401 is associated with a set of switches 403, one of which is shown in further detail. Specifically, each input array switch set includes a switch $S_{AINi}$ for coupling the plate to the analog input voltage $A_{IN+}$ or $A_{IN-}$, a switch $S_{VRi+}$ for coupling to the positive reference voltage rail $V_{REF+}$, a switch $S_{GNDi}$ for coupling to the negative reference rail $V_{REF-}$, in this case GND, and a switch $S_{CMi}$ for coupling to the input common mode voltage $V_{CMI}$ referenced to the differential inputs $A_{IN+}$ and $A_{IN-}$.

A similar set of switches 404, indexed j=1 to m, selectively couple the bottom plates of the capacitors of offset array 402 to the input signal ($A_{IN+}$ or $A_{IN-}$) and the reference voltage ($V_{REF+}$) and GND. After the SAR bit cycling process, the state of switches 403 represent the digitally coded input sample and is stored in registers 406 for output.

According the inventive principles, the offset voltage caused by the non-infinite CMR is captured on the top plates of the input capacitor arrays. This offset is then compensated using calibration arrays 402. This process is generally illustrated in FIGS. 5A and 5B.

Figure 5A:
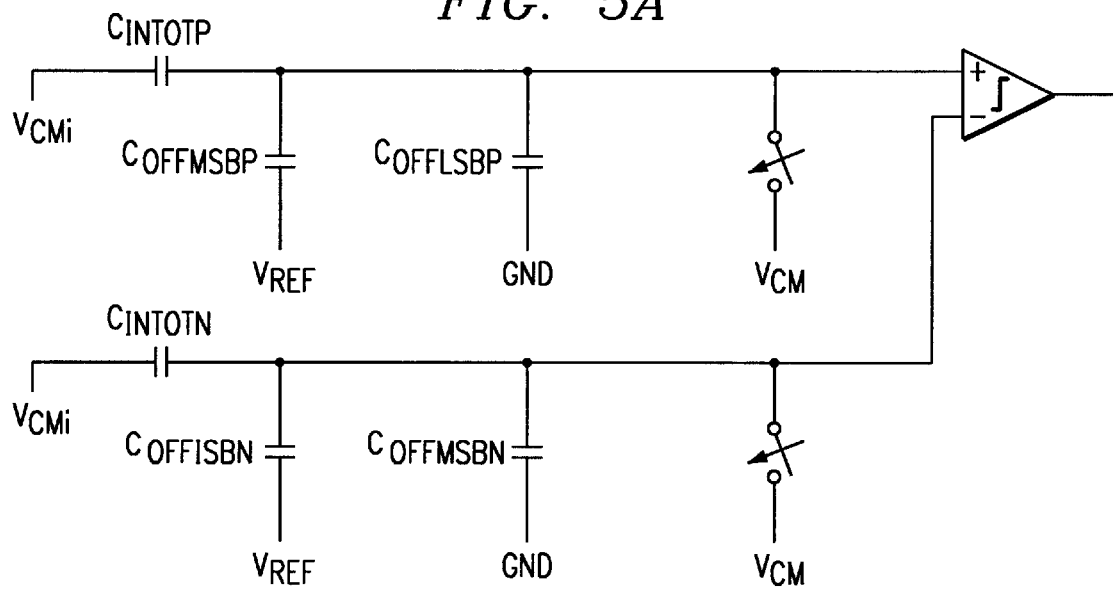
FIG. 5A is a conceptual schematic diagram illustrating a typical configuration during the offset voltage compensation sampling phase.
Figure 5B:
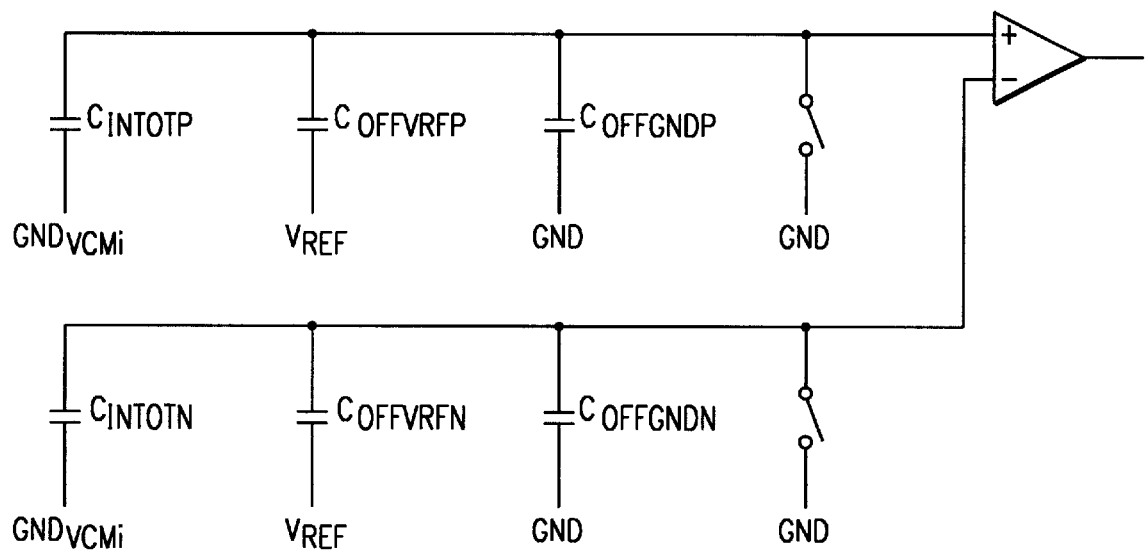
FIG. 5B is a conceptual schematic diagram illustrating a typical configuration during the offset voltage compensation conversion phase.

During the offset compensation sampling phase shown in FIG. 5A, the common mode voltage $V_{CM}$ is sampled onto all the input capacitors $C_{INTOTP}$ and $C_{INTOTN}$, of the positive and negative paths. At the same time, the bottom plates of the positive path offset capacitors $C_{OFFMSBP}$ and $C_{OFFLSBP}$ are coupled to $V_{REF}$ and Gnd, respectively. The complementary negative path offset capacitors $C_{OFFMSBN}$ and $C_{OFFLSBN}$ are coupled to Gnd and $V_{REF}$, respectively. ("Complementary" sets of capacitors are those coupled by the appropriate switches at a given instant to opposing reference voltages. For example, if capacitor $C_{INPi}$ in input array 401a at the positive comparator input is coupled to $V_{REF}$, then the corresponding capacitor in $C_{INNi}$ in input array 401b at the negative comparator input is coupled to GND, and vice versa. Similarly, if a capacitor $C_{OFFPj}$ in offset array 402a is coupled to $V_{REF}$, capacitor $C_{OFFNj}$ in offset array 402b is coupled to GND, and vice versa.)

At the start of the calibration conversion phase, the bottom plates of the input capacitors $C_{INTOTP}$ and $C_{INTOTN}$ are coupled to $GND_{VCM}$, which is the ground against which the common mode voltage Vcm is referenced. A SAR bit cycling process is then performed using only the offset capacitors $C_{OFFPj}$ and $C_{OFFNj}$. The bits on the offset capacitors after bit cycling approximate the inverse of the offset voltage $V_{OFF}$, such that the bit positions of the corresponding switches represent the offset compensation code. This code encompasses not only the voltage offset introduced by the comparator, but also that caused by the finite CMR of the capacitor arrays.

During subsequent normal mode operation, the input capacitors $C_{INTOTP}$ and $C_{INTOTN}$ are coupled to the system inputs to sample the differential analog inputs $A_{INP}$ and $A_{INN}$. During normal mode sampling, the MSB offset capacitor of the positive path and the LSB offset capacitors of the negative path are coupled to $V_{REF}$ while the LSB offset capacitors of the positive path and the MSB capacitor of the negative path are coupled to ground. A SAR bit cycling operation is then performed through the input capacitors $C_{INPi}$ and $C_{INNi}$. During the normal operation conversion phase, the offset capacitors $C_{OFFPj}$ and $C_{OFFNj}$ are selectively coupled to $V_{REF}$ and ground to reflect the offset compensation codes determined during the calibration operations.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A method of compensating for finite common mode rejection in a switched capacitor circuit including arrays of input capacitors coupled to first and second differential nodes comprising the steps of:

sampling a common mode voltage onto the differential nodes during a sampling phase;

coupling the input capacitors to a ground node against which said common mode voltage is referenced to capture an offset voltage between the first and second differential nodes; and subtracting out the voltage offset comprising the substep of selectively coupling capacitors of first and second compensation capacitor arrays coupled to the corresponding first and second differential nodes to a selected one of first and second reference voltages.

2. The method of claim 1 wherein said step of subtracting comprises the substep of performing a successive approximation bit-cycling operation through the first and second capacitor arrays.

3. The method of claim 1 wherein the first and second differential nodes are coupled to first and second differential inputs of a comparator.

4. The method of claim 3 wherein the comparator forms a portion of a analog to digital converter.

5. A switched capacitor circuit comprising:

a first data path including parallel input and compensation capacitor arrays coupled to a first node;

a second data path including parallel input and compensation capacitor arrays coupled to a second node; and switching circuitry for:

coupling the input capacitor arrays of the first and second paths to a common mode voltage during a sampling phase, the common mode voltage referenced to a selected ground node;

coupling the input capacitor arrays of the first and second paths to the selected ground node to capture a voltage offset between the first and second nodes; and selectively coupling capacitors of the compensation arrays of the first and second data paths to a selected one of first and second reference voltages to compensate for the voltage offset.

6. The switched capacitor circuit of claim 5 and further comprising a successive approximation return path for bit-cycling through said capacitors of said compensation arrays for selectively coupling capacitors to the first and second reference voltages.

7. The switched capacitor circuit claim 5 and further comprising a comparator having first and second differential inputs coupled to said first and second nodes.

8. The switched capacitor circuit of claim 5 wherein said first and second input paths form a portion of a charge redistribution analog to digital converter.

9. The switched capacitor circuit of claim 5 wherein the compensation arrays comprise coarse and fine compensation arrays.

10. The switched capacitor circuit of claim 5 wherein said switched capacitor circuit forms a portion of an integrated circuit operating from a selected power supply voltage and said common mode voltage is approximately one-half of said power supply voltage.

11. The switched capacitor circuit of claim 5 wherein said first reference voltage is a positive voltage and said second reference voltage is approximately equal to ground.

12. A charge redistribution analog to digital converter comprising:

a comparator having first and second differential inputs;

first and second bit-weighted input capacitor arrays coupled respectively to the first and second inputs of the comparator;

first and second bit-weighted compensation capacitor arrays coupled respectively to the first and second inputs of the comparator; and switching circuitry operable to compensate for finite common mode rejection at the first and second inputs of the comparator, said switching circuitry operable to:

capture an offset voltage caused by the finite common mode rejection on the first and second input arrays; and subtract out the voltage offset with the first and second compensation arrays.

13. The analog to digital converter of claim 12 wherein said switching circuitry captures the offset voltage by:

coupling the first and second input arrays to a common mode voltage; and coupling the first and second inputs arrays to a ground node against which the common mode voltage is referenced to capture the offset voltage.

14. The analog to digital converter of claim 12 wherein said switching circuitry subtracts out the voltage offset by selectively coupling capacitors of the first and second capacitor arrays to selected reference voltages.

15. The analog to digital converter of claim 13 and further comprising a successive approximation return path for selectively coupling capacitors of the first and second input arrays to selected reference voltages during a data conversion operation.

16. The analog to digital converter of claim 15 wherein said compensation arrays each comprise a selected one of coarse and fine compensation arrays coupled to said inputs of said comparator.

17. The analog to digital converter of claim 15 wherein said analog to digital converter is one of a plurality of like analog to digital converters disposed in parallel on an integrated circuit.

* * * * *